(12) United States Patent
Sandell et al.

(10) Patent No.: US 10,903,861 B2
(45) Date of Patent: Jan. 26, 2021

(54) METHOD AND DEVICE FOR GENERATING SOFT DECISION DETECTION PARAMETERS

(71) Applicants: Kabushiki Kaisha Toshiba, Minato-ku (JP); Toshiba Memory Corporation, Minato-ku (JP)

(72) Inventors: Magnus Stig Torsten Sandell, Bristol (GB); Amr Ismail, Bristol (GB)

(73) Assignees: Kabushiki Kaisha Toshiba, Minato-ku (JP); Toshiba Memory Corporation, Minato-ku (JP)

(*) Notice: Subject to any disclaimer, the term of this patent is extended or adjusted under 35 U.S.C. 154(b) by 0 days.

(21) Appl. No.: 16/268,046

(22) Filed: Feb. 5, 2019

(65) Prior Publication Data

US 2020/0250030 A1   Aug. 6, 2020

(51) Int. Cl.
| | |
|---|---|
| *H03M 13/45* | (2006.01) |
| *G06F 3/06* | (2006.01) |
| *G11C 29/52* | (2006.01) |
| *G06F 11/10* | (2006.01) |

(52) U.S. Cl.
CPC ........ *H03M 13/458* (2013.01); *G06F 3/0619* (2013.01); *G06F 3/0653* (2013.01); *G06F 3/0679* (2013.01); *G06F 11/1068* (2013.01); *G11C 29/52* (2013.01); *H03M 13/45* (2013.01)

(58) Field of Classification Search
CPC ... H03M 13/458; H03M 13/45; G06F 3/0679; G11C 29/52
See application file for complete search history.

(56) References Cited

U.S. PATENT DOCUMENTS

| | | | |
|---|---|---|---|
| 9,235,467 B2 * | 1/2016 | Micheloni | G06F 11/1012 |
| 9,916,906 B2 | 3/2018 | Wu et al. | |
| 10,176,041 B2 * | 1/2019 | Wu | G06F 11/1068 |
| 10,469,103 B1 * | 11/2019 | Jeong | H03M 13/1125 |

(Continued)

OTHER PUBLICATIONS

Haochuan Song, Frankie Fu, Cloud Zeng, Jin Sha, Zaichen Zhang, Xiaohu You & Chuan Zhang;Polar-Coded Forward Error Correction for MLC NAND Flash Memory; Science China, Information Sciences 61(10); Feb. 2018 (Year: 2018).*

(Continued)

*Primary Examiner* — Joseph D Torres
(74) *Attorney, Agent, or Firm* — Oblon, McClelland, Maier & Neustadt, L.L.P.

(57) ABSTRACT

A method of generating soft decision detection parameters for a plurality of received signals. The method comprises defining a hard decision boundary and a plurality of quantisation intervals wherein each quantisation interval extends from the hard decision boundary by an interval distance, selecting a log likelihood value from a set of log likelihood values for each received signal based on the quantisation interval in which the received signal is detected, performing a soft decoding using a plurality of log likelihood values, adjusting the set of log likelihood values based on a result of the soft decoding, determining an error probability for a quantisation interval, comparing the error probability against a target error probability and adjusting the interval distance in order to obtain the target error probability.

20 Claims, 10 Drawing Sheets

(56) References Cited

U.S. PATENT DOCUMENTS

| | | | |
|---|---|---|---|
| 2012/0213001 A1* | 8/2012 | Yang | G06F 11/1048 |
| | | | 365/185.2 |
| 2013/0163328 A1* | 6/2013 | Karakulak | G11C 16/10 |
| | | | 365/185.2 |
| 2014/0040704 A1* | 2/2014 | Wu | G06F 11/1068 |
| | | | 714/773 |
| 2015/0200688 A1* | 7/2015 | Pan | G11C 11/5642 |
| | | | 714/794 |
| 2016/0277041 A1 | 9/2016 | Zhang et al. | |
| 2020/0177210 A1 | 6/2020 | Sandell et al. | |

OTHER PUBLICATIONS

E. Sharon and A. Bazarsky, "Dynamic Memory Error Model Estimation for Read and ECC Adaptations," in Nonvolatile Memory Workshop, San Diego, USA, Mar. 12-14, 2017 w/Abstract, pp. 1-21.

J. Wang et al., "Enhanced Precision Through Multiple Reads for LDPC Decoding in Flash Memories," in IEEE Journal on Selected Areas in Communications, vol. 32, No. 5, pp. 880-891, May 2014, doi: 10.1109/JSAC.2014.140508.

G. Dong, N. Xie and T. Zhang, "On the Use of Soft-Decision Error-Correction Codes in nand Flash Memory," in IEEE Transactions on Circuits and Systems I: Regular Papers, vol. 58, No. 2, pp. 429-439, Feb. 2011, doi: 10.1109/TCSI.2010.2071990.

* cited by examiner

METHOD AND DEVICE FOR GENERATING SOFT DECISION DETECTION PARAMETERS

FIELD

Embodiments described herein relate generally to methods and devices for generating soft decision detection parameters and particularly to ways of determining hard and soft decision boundaries for soft decoding of received signals.

BACKGROUND

Memory cells in NAND flash memory consist of field effect transistors that comprise a floating gate interposed between the gate and the channel. In order to determine the storage state of the memory cell, a first bias voltage is applied to the gate of the memory cell while a second bias voltage is applied across the channel of the memory cell.

During the reading process at least one bias voltage is applied to the gate of the memory cell. In a NAND flash memory the conductivity of the memory cell's channel is defined by the amount of charge stored on the floating gate and by the bias voltage applied to the gate of said memory cell.

By sensing the source-drain current that flows through the channel of a flash memory cell; the reading process can determine the amount of charge stored in the floating gate and consequently the data value stored by the flash memory cell.

Unlike ideal transistors, practical memory cells are subject to various types of impairments that affect their performance, such as inaccurate programming, retention noise, random telegraph noise, device aging and inter cell interference. These impairments can influence the conductivity of the memory cell being read, thereby potentially falsifying the perceived storage state of the cell in question.

As flash memory architectures continue to be miniaturised these effects will become more pronounced, thereby presenting a challenge to the accurate determination of a memory cell's stored state.

One way of mitigating these challenges is to employ soft-decision error correction codes. Error-correcting codes (ECC) are often used in communications and storage applications to protect against reading errors. Although there are many types of Error-correcting codes, most of them work better if, as part of their decoding, an indication of reliability of the decoding is provided instead of simply a binary decoding decision.

In some case, it is possible to compute an indication of decoding reliability based on the system model. However in other cases, the system model is too complicated to allow such computation to be performed efficiently, or even at all. In flash memory systems it is common for the threshold voltage (i.e. the applied gate voltage at which the channel conducts) to be compared against soft decision boundaries so that the controller is able to generate soft information (e.g., LLRs) for use by the iterative decoder.

In order to generate this soft information it is first necessary to set the hard and soft decision boundaries, or in other words, define the voltage bins which are associated with particular LLR values. These boundaries should ideally be positioned at the transition between two storage states. While storage states are well defined when the device is made, as the device ages the points at which a certain threshold voltage is reliably associated with a stored data state can change, thereby preventing accurate recovery of the stored data. For this reason a new approach to dynamically generating soft decision information in a flash memory is required.

Arrangements of the embodiments will be understood and appreciated more fully from the following detailed description, made by way of example only and taken in conjunction with drawings in which.

DETAILED DESCRIPTION

Figure 1:
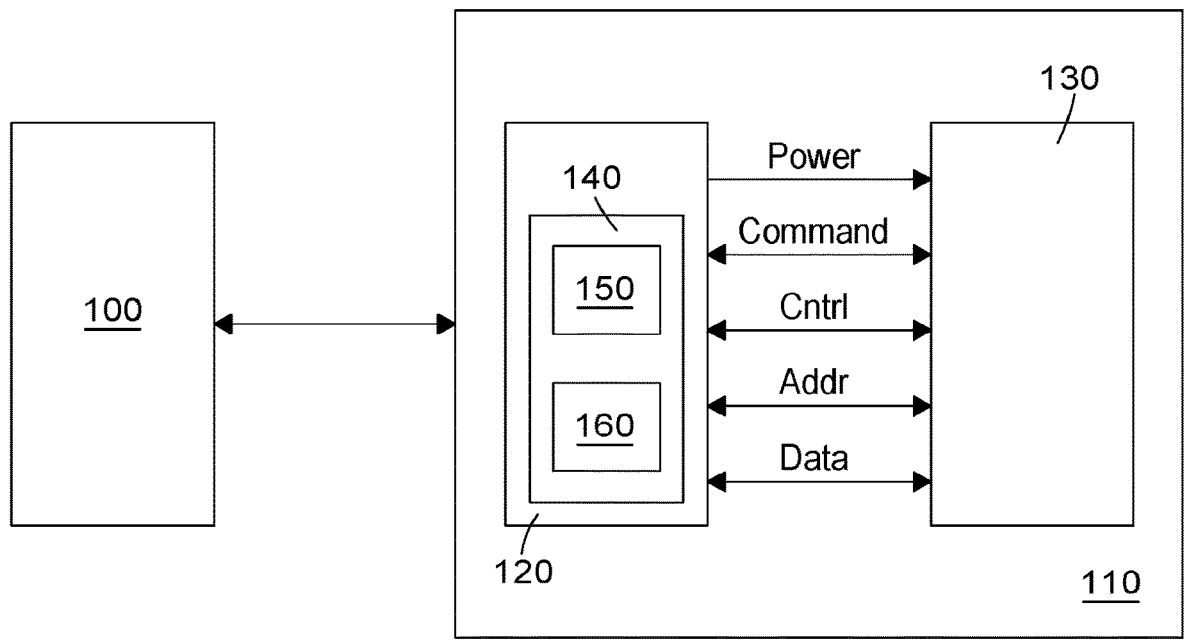
FIG. 1 shows a system that comprises a computing device and non-volatile Flash storage memory.

According to an embodiment there is provided a method of generating soft decision detection parameters for a plurality of received signals. The method comprises defining a hard decision boundary and a plurality of quantisation intervals wherein each quantisation interval extends from the hard decision boundary by an interval distance. The method further comprises selecting a log likelihood value from a set of log likelihood values for each received signal based on the quantisation interval in which the received signal is detected, performing a soft decoding using a plurality of log likelihood values, adjusting the set of log likelihood values based on a result of the soft decoding, determining an error probability for a quantisation interval, comparing the error probability against a target error probability, and adjusting the interval distance in order to obtain the target error probability.

The method could be used for decoding data stored in a non-volatile memory, the non-volatile memory comprising a plurality of memory cells wherein: each memory cell stores data by adopting one of a plurality of storage states, and the plurality of received signals are the threshold voltages for the plurality of memory cells.

The method could be used for generating modulated symbols from a received communications signal. In this example each of the received signals corresponds to a sample of the received communications signal.

In an embodiment the error probability for a quantisation interval is determined using a log likelihood value from the adjusted set of log likelihood values.

The error probability may be determined according to:

$$|L_r| = \log \frac{1 - P_e^{(r)}}{P_e^{(r)}}.$$

Separately, each log likelihood value from the set of log likelihood values may be associated with a quantisation interval. Additionally this association may be unique such that each log likelihood value corresponds to a different quantisation interval.

In an embodiment the method further comprises adjusting the hard decision boundary by: calculating a fraction of the plurality of received signals that have a detected value which is less than the hard decision boundary, determining whether the fraction of the received signals is less than a threshold. The method further comprises modifying the hard decision boundary by: reducing the hard decision boundary when the fraction is greater than the threshold; and increasing the hard decision boundary when the fraction is less than the threshold.

In an embodiment the threshold equals an expected number of received signals with a detected value which is less than the hard decision boundary relative to a total number of received signals.

The expected number of received signals may be determined based on the assumption that each system state (i.e. a data storage state in the flash memory or a symbol in a modulation scheme) is equally likely to occur.

In an embodiment adjusting the interval distance in order to obtain a target error probability further comprises: increasing the interval distance when the error probability is greater than the target error probability; and decreasing the interval distance when the error probability is less than the target error probability.

In an embodiment the plurality of quantisation intervals comprises a first quantisation interval that extends to a first soft decision boundary wherein the first soft decision boundary is less than the hard decision boundary and a second quantisation interval that extends to a second soft decision boundary wherein the second soft decision boundary is greater than the hard decision boundary.

In an embodiment the method is repeated for each hard decision boundary of a number of hard decision boundaries, said number equalling a total number of system states minus one.

The total number of states may equal the number of data storage states in a flash memory or the number of symbols in a modulation scheme.

In an embodiment the method further comprises adjusting the set of log likelihood values based on the adjusted interval distance.

In an embodiment the method is repeated after a predetermined number of signals have been received.

According to another embodiment there is provided a non-transitory storage medium storing computer program instructions for execution by a processor and that, when executed by the processor, cause the processor to perform any of the above discussed methods.

According to another embodiment there is provided a device for generating soft decision detection parameters for a plurality of received signals. The device comprises a processor and a memory storing instructions for execution by the processor. The instructions causing the processor when executing the instructions to: define a hard decision boundary and a plurality of quantisation intervals wherein each quantisation interval extends from the hard decision boundary by an interval distance, select a log likelihood value from a set of log likelihood values for each received signal based on the quantisation interval in which the received signal is detected, perform a soft decoding using a plurality of log likelihood values, adjust the set of log likelihood values based on a result of the soft decoding, determine an error probability for a quantisation interval, compare the error probability against a target error probability; and adjust the interval distance in order to obtain the target error probability.

In an embodiment the error probability for a quantisation interval is determined using a log likelihood value from the adjusted set of log likelihood values.

In an embodiment the instructions further cause the processor, when executing the instructions to adjust the hard decision boundary by: calculating a fraction of the plurality of received signals that have a detected value which is less than the hard decision boundary, determining whether the fraction of the received signals is less than a threshold, and modifying the hard decision boundary. The hard decision boundary being modified by: reducing the hard decision boundary when the fraction is greater than the threshold; and increasing the hard decision boundary when the fraction is less than the threshold.

In an embodiment the threshold equals an expected number of received signals with a detected value which is less than the hard decision boundary relative to a total number of received signals.

In an embodiment adjusting the interval distance in order to obtain a target error probability further comprises: increasing the interval distance when the error probability is greater than the target error probability; and decreasing the interval distance when the error probability is less than the target error probability.

In an embodiment the plurality of quantisation intervals comprises a first quantisation interval that extends to a first soft decision boundary wherein the first soft decision boundary is less than the hard decision boundary; and a second quantisation interval that extends to a second soft decision boundary wherein the second soft decision boundary is greater than the hard decision boundary.

In an embodiment the instructions are repeated for each hard decision boundary of a number of hard decision boundaries, said number equalling a total number of system states minus one.

In an embodiment the instructions further cause the processor when executing the instructions to adjust the set of log likelihood values based on the adjusted interval distance.

In an embodiment the instructions are repeated after a predetermined number of signals have been received.

In another embodiment there is provided a signal receiver comprising any of the aforementioned devices for generating soft decision detection parameters. The signal receiver is further configured to generate soft decision information for a signal using the hard decision boundary and the interval distance determined by the device.

The signal receiver may further be configured to determine, from the soft decision information obtained by the signal receiver, the modulated data symbol communicated by the signal.

In another embodiment there is provided a flash memory comprising a plurality of flash memory cells and any of the aforementioned devices for generating soft decision detection parameters. The flash memory may further be configured to read one or more a flash memory cells and generate soft decision information for the flash memory cell using the hard decision boundary and the interval distance determined by the device.

The memory cells for and based on which the soft decision detection parameters are determined may be all of the memory cells in a memory array or on a memory chip but may alternatively only be a sub-set thereof, such as, for example, an individual block of flash memory cells or a group of blocks of flash memory cells. Such a group may comprise blocks of memory cells that are deemed to have aged at the same rate.

The plurality of received signals used by the device for generating soft decision detection parameters may corresponds to the threshold voltages for a plurality of memory cells, said plurality of memory cells comprising the flash memory cell for which the soft decision information is (later) determined.

In an embodiment the flash memory is further configured to determine the data stored by the flash memory cell using soft decoding and the soft decision information.

Error correction codes to which soft decoding can be applied include a LDPC (low-density parity check) code, a BCH code, a turbo code, an RS (Reed-Solomon code), a convolution code, an RSC (Recursive Systematic Code), or coded modulation such as TCM (Trellis-Coded Modulation), BCM (Block Coded Modulation), and so on. These error correction codes are often used in conjunction with a soft-decision decoding algorithm (also known as a soft deciding algorithm). These soft deciding algorithms can include, amongst others, mini-sum algorithms and Viterbi decoding.

For soft decoders to work in the best possible way they require knowledge of the read information reliability. By using soft decoding as opposed to hard-decision decoding it is possible boost the reliability of the flash memory beyond its current limits.

As previously discussed, a memory cell's characteristics can vary significantly over the course of its operation depending on numerous factors including ambient temperature, program-erase cycles, retention time, among others. As a result the estimated soft metrics (i.e., the log likelihood ratios) need to be updated to avoid performance degradation.

During the reading process it is common place for a number of bias voltages to be applied to the memory cell's gate. By monitoring the level of conduction for each bias voltage it is possible to determine a voltage bin in which the memory cell conducts (i.e. the region between a conducting and a non-conducting bias voltage). Each voltage bin has an LLR value associated with it which varies according to the probability distributions of the data storage states.

As memory cells age and are subject to repeated use the probability distributions of the storage states change and as a result so does the reliability that a particular voltage bin is associated with a specific data value.

Furthermore, as will be discussed in more detail below, as the probability distributions of the data states change, so does the amount of information which is obtained by determining that the memory cell conducts in a particular voltage bin. As a result, in order to boost the reliability of flash memory, not only is it necessary to dynamically update the LLR values for a voltage bin, but it is also necessary to dynamically update the size and position of the voltage bins themselves.

FIG. 1 shows a system that comprises a computing device 100 and non-volatile Flash storage memory 110. The computing device may be a mobile computing device, such as a mobile phone, tablet computer, laptop, camera or any other type of mobile computing device. Alternatively the computing device 100 may be stationary, such as a desktop computer or indeed part of a stationary server or part of a storage bank, such as part of a RAID solution.

The non-volatile Flash storage memory 110 may take any form of non-volatile storage device comprising Flash memory. The non-volatile Flash storage memory 110 may, for example, be a "thumb drive", a solid-state drive (SSD) or a memory card.

The computing device 100 and the non-volatile Flash storage memory 110 are in communicative connection with each other in a manner that allows the computing device 100 to transmit data and commands indicating the processing that the data is to be subjected to by the non-volatile Flash storage memory 110. The communicative connection also allows the non-volatile Flash storage memory 110 to return data retrieved from memory to the computing device 100. The computing device 100 may also provide power to the non-volatile Flash storage memory 110.

A number of interfaces that allow communication between a computing device 100 and a non-volatile Flash storage memory 110 are known. The exact nature of the interface is not pertinent to the embodiments however exemplary interfaces include the USB interface, SD, microSD, xD, CompactFlash, MMC, to name but a few.

The non-volatile Flash storage memory 110 comprises a memory controller 120 and a non-volatile flash memory 130. The memory controller 120 interfaces with the computing device 100 as well as with the flash memory 130. The memory controller 120 provides power to the flash memory 130 and is moreover connected to the flash memory 130 via command, control, address and data lines. The memory controller 120 may control all of the operations of the flash memory 130.

The memory controller 120 comprises a control unit 140 which is configured to read data from the non-volatile flash memory 130. The control unit 140 comprises a microprocessor 150 and a memory 160. In FIG. 1 the microprocessor 150 is communicatively coupled to the memory 160. The microprocessor 150 is also communicatively coupled to the non-volatile flash memory 130 via the command, control, address and data lines. The memory 160 stores computer readable instructions which, when executed by the processor 150, cause the processor 150 to carry out the methods described herein. In an embodiment the control unit 140 is the device for generating soft decision detection parameters. In another embodiment the control unit 140 is configured to read and write data to and from the non-volatile flash memory 130 using the parameters generated by the methods described herein.

Figure 2:
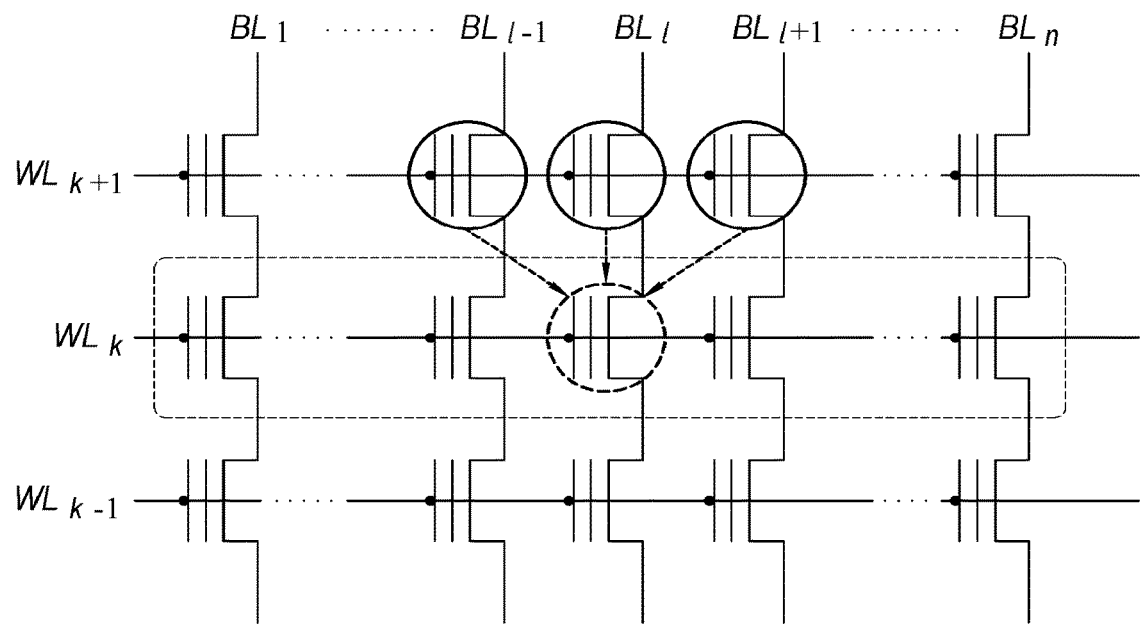
FIG. 2 shows an exemplary NAND flash memory.

FIG. 2 shows an exemplary NAND flash memory. As shown in FIG. 2, memory cells in NAND flash memory consist of field effect transistors (FET's) comprising a floating gate interposed between the FET's gate and channel.

NAND flash memory cells are organised into multiple blocks. Memory cells within each block are arranged horizontally along word-lines. These wordline connect the gates of horizontally adjacent FETs and are labelled in FIG. 2 as $WL_{k+1}$, $WL_k$ and $WL_{k-1}$.

Memory cells within each block are also arranged vertically along (often thousands of) bit-lines (labelled as $BL_1$ to $BL_n$ in FIG. 2), which connect the drains and the sources of vertically adjacent FETs. The control gates of all the cells along a word-line are connected to the address bus while the drains of the cells along a bit-line are connected to the data bus.

Figure 3:
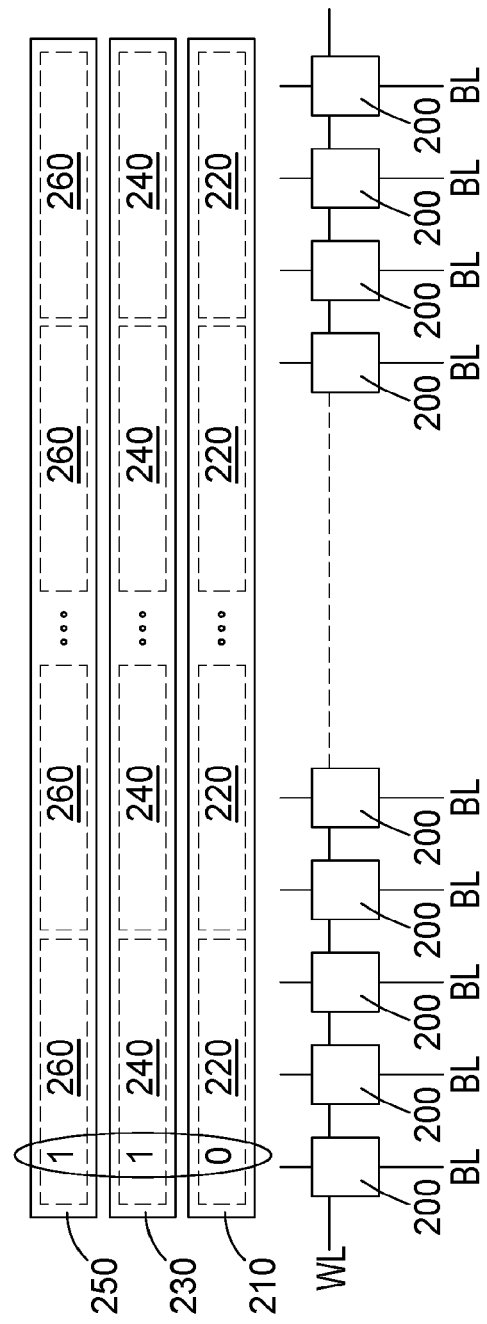
FIG. 3 illustrates a number of memory cells arranged along a word-line (WL)

FIG. 3 illustrates a number of memory cells 200 arranged along a word-line (WL). Although only a few memory cells 200 are shown in FIG. 3, several thousand memory cells may be arranged along each word-line (WL). Several word-lines (WL) tend to be arranged so that their memory cells are connected (in FIG. 3 in the vertical direction) along bit lines BLs. In an embodiment all memory cells along a word line WL are programmed simultaneously.

The data unit used for programming is illustrated in FIG. 3 by logical page 210. Each logical page may comprise smaller sub-units 220. The sub-units are referred to as codewords in embodiments described herein. More generally, however, a codeword is a string of data that has its own error correction codes associated with it. A sub-unit may, for example be 512kByte in size to mimic the size of hard drive sectors and so that the flash memory can be addressed in the same manner as hard drives.

For memory cells 200 that only store a single bit of data (i.e. Single-level Cells (SLCs)) it is sufficient to only distinguish between two storage states (i.e. a binary '1' and '0'). For memory cells that store more than one bit of data (i.e. Multi-Level Cells (MLCs) for two data bits, Triple-Level Cells (TLCs) for three data bits, Quad-level Cells (QLCs) for four bits, and so on) the program and read circuitry connected to the word and/or bit lines respectively must be configured to distinguish between more than two storage states.

Figure 4A:
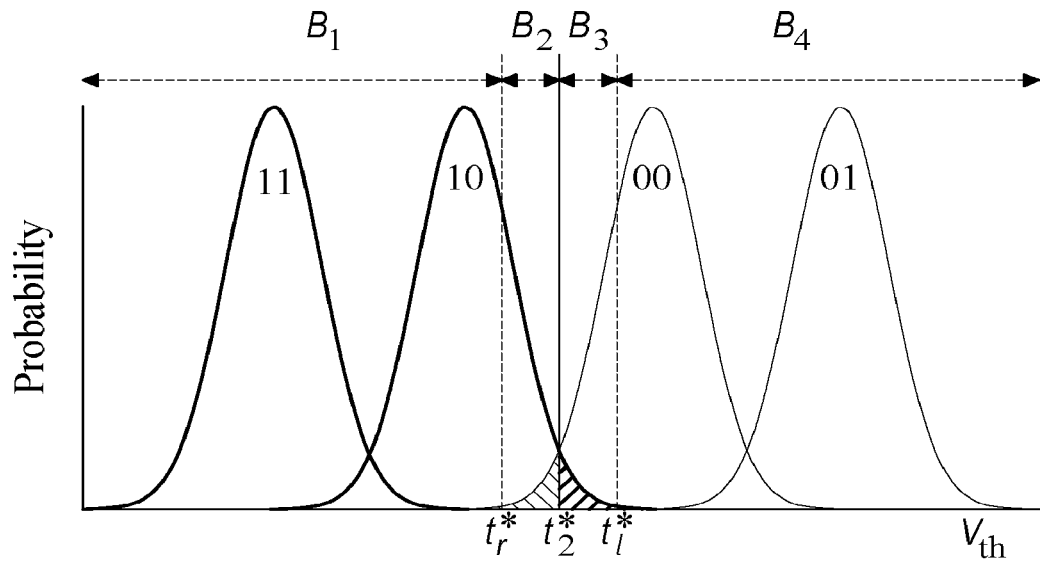
FIG. 4a shows an exemplary probability distribution for each state of a Multi-level cell superimposed with a set of decision boundaries for the MSB.

FIG. 4a shows an exemplary probability distribution for each state of a Multi-level cell superimposed with a set of decision boundaries for the MSB. As shown in FIG. 4a, in order to read two bits of data from a memory cell, it is necessary to distinguish between four possible storage states.

Figure 4B:
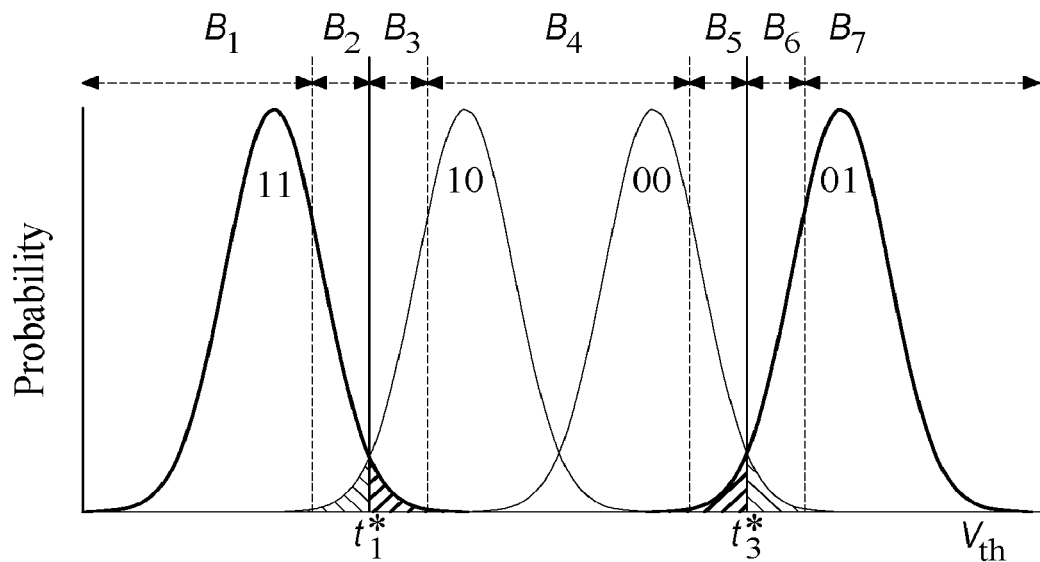
FIG. 4b shows an exemplary probability distribution for each state of a Multi-level cell superimposed with a set of decision boundaries for the LSB.

FIG. 4b shows an exemplary probability distribution for each state of a Multi-level cell superimposed with a set of decision boundaries for the LSB.

In FIG. 4a and FIG. 4b both sets of decision boundaries comprise a hard decision boundary surrounded on either side by a soft decision boundary. As will be discussed in more detail below; the soft decision boundaries or more specifically the distance between the hard decision boundary and the soft decision boundaries are sought to be optimised through maximizing the mutual information between the input and the quantized read voltage.

As can be seen from both FIG. 4a and FIG. 4b, the overlap between the probability distributions of the storage states in a 2-bit memory cell expose a situation in which charges injected in the floating gate of a cell in an attempt to program it to a particular storage state, say to the "00" state (predominantly to the right of the $t_2^*$ hard decision boundary), cause the cell to conduct at a threshold voltage that is somewhat below the voltage $t_2^*$ (i.e. the hatched area of the "00" storage state distribution that falls to the left of the $t_2^*$ threshold voltage). If this happens the storage state of the memory cell could be incorrectly determined, in this example as storage state "10".

As discussed above, when determining the storage state of a memory cell it is common place to apply a number of different voltages to the gate of the memory cell in order to determine at what voltage a memory cell conducts. Given this information it is subsequently possible to obtain the stored data value by using either hard decision decoding or soft decision decoding.

With hard decision decoding, the value read from the memory cell can only take one value from the set of possible stored data values. As an example, in FIG. 4a, the hard decision boundary is marked by the voltage $t_2^*$. As a result, if the threshold voltage for channel conduction is less than $t_2^*$ then the hard estimate for the MSB of the stored data value will be a '1'. Likewise, if the threshold voltage for channel conduction is greater than $t_2^*$ then the hard estimate for the MSB of the stored data value will be '0'. This process can be replicated for determining the value LSB as shown in FIG. 4b where the hard decision boundaries are labelled as $t_1^*$ and $t_3^*$.

FIG. 4a also shows a number of soft decision boundaries which are used for soft decision decoding. Unlike hard decision decoding where a stored value is determined from amongst the set of possible stored values, in soft decision decoding the threshold voltage is used to generate a measure of the reliability (i.e. a probability), that the memory cell is storing a certain value. This soft information can subsequently be used along with an error correcting code to robustly prevent erroneous determination of the stored data.

One example of soft information is a log-likelihood ratio (LLR) value. In FIG. 4a, the hard and soft decision boundaries ($t_r^*$, $t_2^*$, $t_l^*$) mark the bounds of the quantisation intervals or voltage bins. Each voltage bin (i.e. $\mathcal{B}_1$, $\mathcal{B}_2$, $\mathcal{B}_3$ and $\mathcal{B}_4$) has a LLR value associated with it, with the LLR value of the $r^{th}$ quantisation interval, $L_r$, being determined according to:

$$L_r = \log \frac{Pr(b=1 \mid y \in I_r)}{Pr(b=0 \mid y \in I_r)} \quad (1)$$

where:
  y is the threshold voltage at which the cell's channel conducts;
  $I_r$ is the $r^{th}$ quantisation interval (or voltage bin); and
  b is the value of the stored data value.

In order to estimate the LLR values it often necessary to know the quantisation intervals, or equally the voltage of the decision boundaries. One way of optimising the position of the decision boundaries, and therefore the size of the quantisation interval, is to use Mutual Information (MI) as a metric. The Mutual Information between two variables is a measure of their mutual dependence. Consequently, by optimising the decision boundaries with respect to the Mutual Information it is possible to maximise the amount of information obtained by the quantisation thereby aiding more accurate data recovery.

Figure 5:
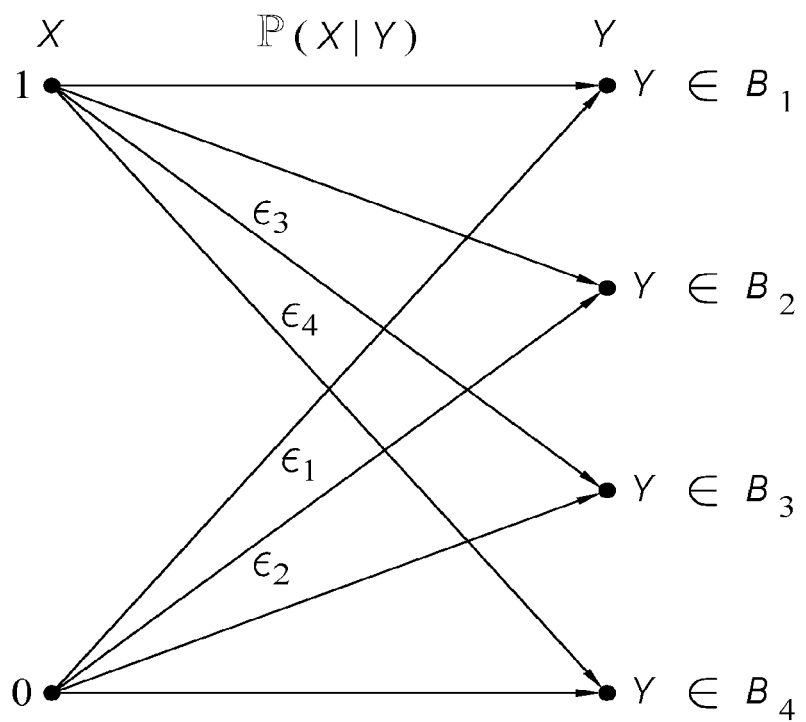
FIG. 5 shows the possible transitions between the programmed bit and the read quantisation interval for the MSB of a MLC.

FIG. 5 shows the possible transitions between the programmed bit and the read quantisation interval for the MSB of a MLC. In this example the quantisation intervals, or voltage bins; $\mathcal{B}_1$ to $\mathcal{B}_4$, correspond to the boundaries formed by the hard and soft decision boundaries of FIG. 4a.

If the probability distributions for all the states shown in FIG. 4a are known then the flash memory cell can be modelled using three reads as a discrete memoryless channel (DMC) with the binary input X being mapped to one of the quantisation intervals; $\mathcal{B}_1$, $\mathcal{B}_2$, $\mathcal{B}_3$ or $\mathcal{B}_4$.

As will be appreciated, if a memory cell is programmed to represent a logical "1" but is subsequently detected to have a threshold voltage that falls within bin $\mathcal{B}_3$ or bin $\mathcal{B}_4$, then the detected programming state is incorrect. Equally if a memory cell that is programmed to represent a logical "0"

is detected to have a threshold voltage that falls within bin $\mathcal{B}_1$ or bin $\mathcal{B}_2$ then the detected programming state is incorrect.

Figure 6:
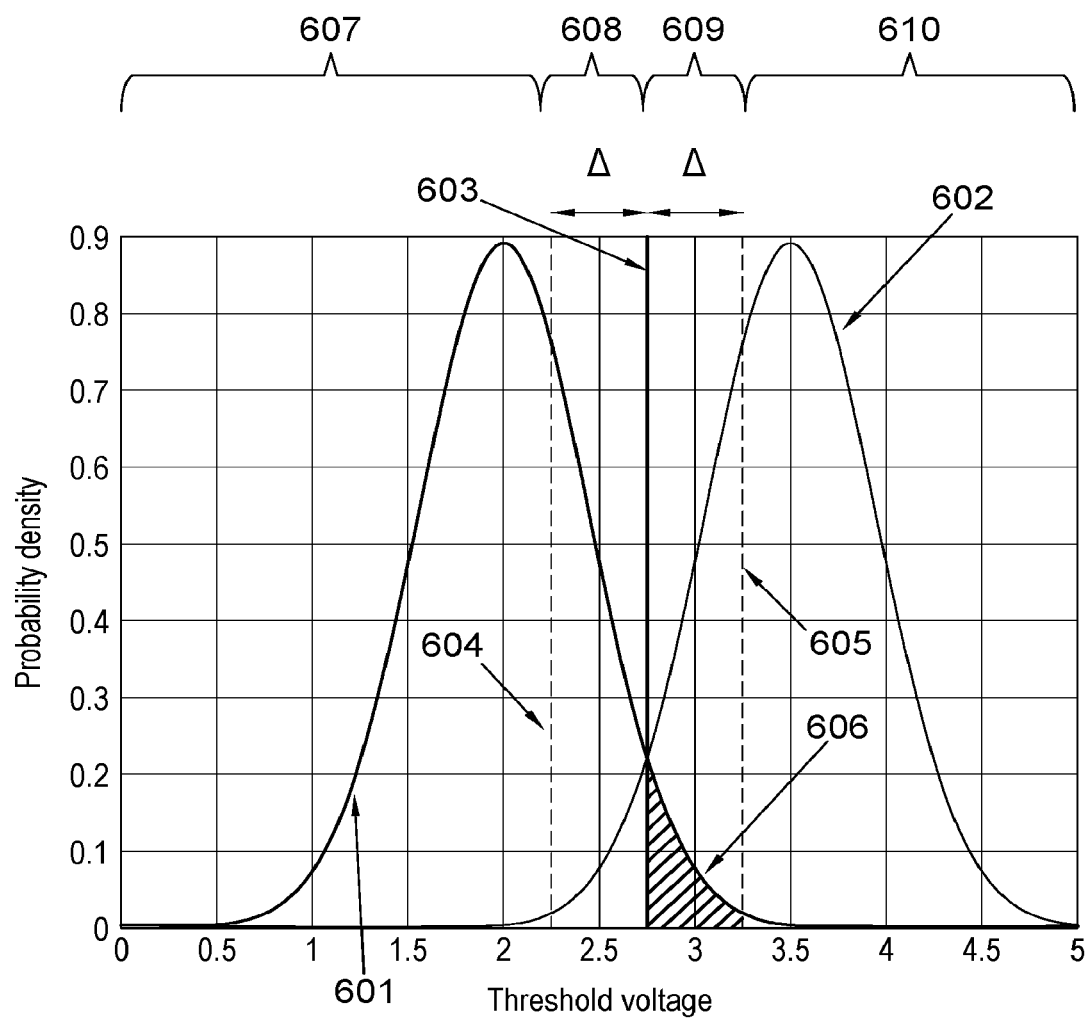
FIG. 6 shows hard and soft decision boundaries between two data storage states of a memory cell.

The total number of errors within a codeword per bin, originating from the binary input X, but being read in the incorrect voltage bins are indicated by $\epsilon_1$ to $\epsilon_4$ in FIG. 6. Arrows in FIG. 6 relating to correctly programmed storage states are not labelled.

Given this, the mutual information between the input, X, and the quantized read voltage, Y, can be expressed as:

$$I(X;Y) = H(X) - H(X|Y) \stackrel{(a)}{=} 1 - \sum_j h_b(\epsilon_j)\mathbb{P}(Y \in \mathcal{B}_j) \quad (2)$$

where:
- $h_b$ is the binary entropy function;
- Y is the quantised read voltage;
- $\mathcal{B}_j$ is the set of possible quantisation intervals, or voltage bins; and
- $\mathbb{P}(x)$ is the probability of the event x occurring.

Consequently, given knowledge of the probability distributions for each stored data state it is possible to determine the transition probabilities ($\epsilon_1, \epsilon_2, \epsilon_3, \epsilon_4$) for the 2×4 discrete memoryless channel, thereby enabling the mutual information between the input (stored value) and the output (read value) to be calculated.

Furthermore by adjusting the soft decision boundaries (i.e. $t_r^*$ and $t_l^*$ in FIG. 4a) it is possible to select the quantisation intervals such that the mutual information (MI) between the binary input X and the quantised read voltage Y is maximised.

While this is clearly advantageous, this is only possible if the probability distributions for each storage state of the memory cell are known. This is particularly problematic in real word devices where the probability distributions of the storage states vary over time due to device aging and use. As a result it is often not possible to know the probability distributions of each state in a memory cell and therefore using decision boundaries which were optimal when the device was first manufactured will no longer represent an optimal solution as the device ages. For this reason a new approach to soft decision decoding is required where the decision boundaries change dynamically according to the changing nature of the data storage states.

Even though the probability distributions of each storage state are not know the process of selecting the position and type of decision boundary can be simplified by assuming that two neighbouring data storage distributions (i.e. "10" and "00" in FIG. 4a) have the same shape profile, notwithstanding the fact that they have a different mean. If this is the case then it can be shown that the best three decision boundaries for accurate data recovery are a hard decision boundary and two soft decision boundaries.

Since each bit in a memory cell is normally detected separately the following technique for setting the hard and soft decision boundaries is described with reference to a single boundary between two adjacent data storage states. However, for the avoidance of doubt it is emphasized that the techniques described herein could be applied to setting the hard and soft decision boundaries between every data storage state of a memory cell. Furthermore the following example will be described with using two soft decision boundaries, one either side of the hard decision boundary. However, for the avoidance of doubt it is emphasized that the techniques described herein could be equally applied to setting any number of soft decision boundary pairs.

FIG. 6 shows hard and soft decision boundaries between two data storage states of a memory cell. In FIG. 6 the distribution 601 represents the probability distribution of a first storage state for a given threshold voltage and the distribution 602 represents a probability distribution of a second storage state for a given threshold voltage. FIG. 6 also shows a hard decision boundary 603, a first soft decision boundary 604, a second soft decision boundary 605 as well as the quantisation intervals or voltage bins which are used as part of the decoding process.

In FIG. 6 the quantisation interval 607 represents all threshold voltages less than the first soft decision boundary 604. The second quantisation interval 608 represents all threshold voltages between the first soft decision boundary 604 and the hard decision boundary 603. The third quantisation interval represents all threshold voltages between the first hard decision boundary 603 and the second soft decision boundary 605, while the fourth quantisation interval 610 represents all threshold voltages that are greater than the second soft decision boundary 605. In FIG. 6 the first soft decision boundary 604 and the second soft decision boundary 605 are positioned a distance Δ from the hard decision boundary 603. In the rest of the description, the length or distance of the quantisation interval is equivalent to the voltage difference between the decision boundaries.

FIG. 6 also includes a shaded area 606 which represents the probability that a memory cell whose threshold voltage is in the quantisation interval 609 is storing a value which is represented by the first probability distribution 601.

As demonstrated by the overlapping probability density functions in FIG. 6, it is possible that the detected stored data state will be read incorrectly. One way to quantify this possibility is to use the error probability, $P_e^{(r)}$. The error probability, $P_e^{(r)}$, represents the bit error rate (BER) for the particular quantisation interval r and is related to the LLR magnitude, $|L_r|$, by:

$$|L_r| = \log\frac{1 - P_e^{(r)}}{P_e^{(r)}} \quad (3)$$

This relationship allows the error probability of a quantisation interval, $P_e^{(r)}$, to be estimated by estimating the LLR's of said quantisation interval. Furthermore, when estimating the error probability, $P_e^{(r)}$, it is possible to limit the estimated value to be in the region [0, 0.5] since $|L_r|$ has to be non-negative by definition.

Figure 7:
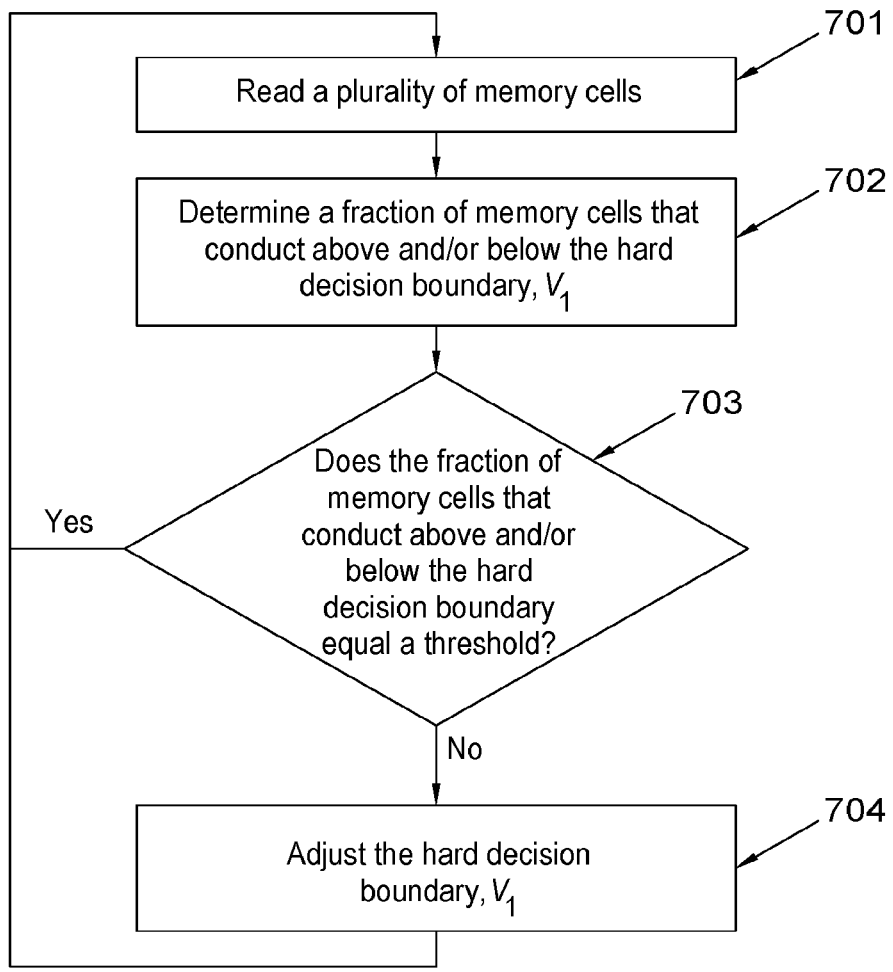
FIG. 7 shows a method of dynamically tracking a hard decision boundary according to an embodiment.

FIG. 7 shows a method of dynamically tracking a hard decision boundary according to an embodiment. The following methods will be described with reference to the system shown in FIG. 1 however it is emphasized that the methods described below could also be implemented in other systems. FIG. 7 starts in step 701 by reading a plurality of memory cells, in the system of FIG. 1 the plurality of memory cells within the non-volatile flash memory 130 are read by the control unit 140. In step 702, the processor 150, determines the fraction of memory cells that conduct above and/or below the hard decision boundary $V_1$ (shown in FIG. 6 as 603). In the case of a hard decision boundary for a single level cell this step of the method is equivalent to determining the fraction of cells storing a '1' and the fraction which are storing a '0'.

In step 703 the processor 150 determines whether the fraction of memory cells that conduct below the hard decision boundary is above or below a threshold. Alternatively, a determination could be made as to whether the fraction of memory cells that conduct above the hard decision boundary is above or below the threshold.

Based on the assumption that each possible data state is equally likely, then, when taken over a plurality of memory cells the percentage of '0's read from the plurality of memory cells should be 50% and the percentage of '1's read from the plurality of memory cells should be 50%. Consequently, if one value is more prevalent than the other then the hard decision boundary needs to be adjusted accordingly.

In step 704 the hard decision boundary is adjusted by the processor 150. In read operations where each data state is equally likely to be read (e.g. the stored value of a single-level cell (SLC), or the MSB of a Multi-level cell), then the hard boundary, $V_1$, is adjusted according to $$V_1 \leftarrow V_1 + \alpha d_{hard} \quad (4)$$

$$\alpha = \begin{cases} 1 & f(V_1) < 1/2 \\ -1 & f(V_1) > 1/2 \end{cases} \quad (5)$$

Where:
$V_1$, is the voltage of the hard decision boundary;
f(x) is the fraction of cells that conduct for a threshold voltage less than x; and
$d_{hard}$ is a pre-defined incremental voltage adjustment.

As an example, if it is determined that more than half of the memory cells conduct with a bias voltage less than the hard decision boundary, $V_1$, then the voltage of the hard decision boundary is adjusted using a pre-defined voltage increment with a negative co-efficient so that the voltage of the hard decision boundary is reduced, resulting in a smaller number of cells conducting below the adjusted hard decision boundary.

In an embodiment the hard decision boundary is stored in the memory 160 for use during subsequent read operations of the non-volatile flash memory 130.

After adjusting the hard decision boundary the method loops back to step 701. If in step 703 it is determined that the fraction of memory cells above and/or below the hard decision boundary equals a threshold then no adjustment is performed and the method loops back to step 701.

In an embodiment the pre-defined incremental voltage adjustment, $d_{hard}$, is set by a user or a manufacturer. The numerical value of the incremental voltage adjustment, $d_{hard}$, depends on the probability distributions of the data storage states for the memory in question. In an embodiment the pre-defined incremental voltage adjustment, $d_{hard}$, is set by a manufacturer after the non-volatile flash memory 130 in question has been evaluated. In an alternative embodiment the incremental voltage adjustment, $d_{hard}$, can be dynamically updated over time.

In yet another embodiment the pre-defined incremental voltage adjustment, $d_{hard}$, is stored in the memory 160.

Before restarting the method at step 701 the processor 150 may wait for a delay to pass. In one embodiment the delay is based on the number of reads and writes performed on the memory cell in question, i.e. every 100 reads, every 1000 reads, every 10000 reads etc. In a further embodiment adjustment of the hard decision boundary is performed after a pre-defined time period has elapsed.

The approach to dynamically adjusting the hard decision boundary with respect to a SLC or the MSB of an MLC, can also be used for dynamically adjusting the hard decision boundaries in memory cells where the expected probability of reading a data storage state is not a half. For example in FIG. 4b the hard decision boundary $t_1^*$, i.e. the left-most LSB, is dynamically tracked according to:

$$V_{t_1^*} \leftarrow V_{t_1^*} + \alpha_1 d_{hard} \quad (6)$$

$$\alpha_1 = \begin{cases} 1 & f(V_{t_1^*}) < 1/4 \\ -1 & f(V_{t_1^*}) > 1/4 \end{cases} \quad (7)$$

Where $V_{t_1^*}$ is the threshold voltage of the hard decision boundary for the LSB when the MSB equals '1'. Likewise, the hard decision boundary $t_3^*$ can be dynamically tracked according to:

$$V_{t_3^*} \leftarrow V_{t_3^*} + \alpha_3 d_{hard} \quad (8)$$

$$\alpha_3 = \begin{cases} 1 & f(V_{t_3^*}) < 3/4 \\ -1 & f(V_{t_3^*}) > 3/4 \end{cases} \quad (9)$$

Where $V_{t_3^*}$ is the threshold voltage of the hard decision boundary for the LSB when the MSB equals '0'.

While in the examples discussed above the same pre-defined voltage increment, $d_{hard}$, is used for setting each of the hard decision boundaries it is anticipated, in a further embodiment that different voltage adjustment increments could be used for adjusting the hard decision boundaries for the MSB, the LSB and/or every bit-level in between.

The technique for dynamically adjusting the hard decision boundaries discussed above can be extended for memory cells that store an arbitrary number of data bits based on the assumption that each data state is equally likely to be read when considered over a plurality of memory cells.

Since the hard decision boundaries have been dynamically adjusted to reflect the changing probability distributions of the stored data states it is also necessary to adjust the soft decision boundaries in order to optimise the performance of the soft decoder.

One way of generating the soft decision boundaries is to add a predetermined interval distance (Δ) to the newly adjusted hard decision boundary $V_1$, thereby generating new soft decision boundaries $V_1+\Delta$ and $V_1-\Delta$.

While this approach is conceptually simple it fails to account for the changing probability distributions of the memory cell's storage states which occur as the memory cell ages or as a result of use. Since the optimal position of the soft decision boundaries (i.e. $V_1+\Delta$ and $V_1-\Delta$) with respect to mutual information changes as the probability distributions of the storage states change, it is necessary to dynamically adjust the position of the soft decision boundaries, both in terms of the absolute value of the soft decision boundary (i.e. $V_1+\Delta$ and $V_1-\Delta$) but also by adjusting their relative distance to the hard decision boundary (i.e. the interval distance Δ).

Figure 8:
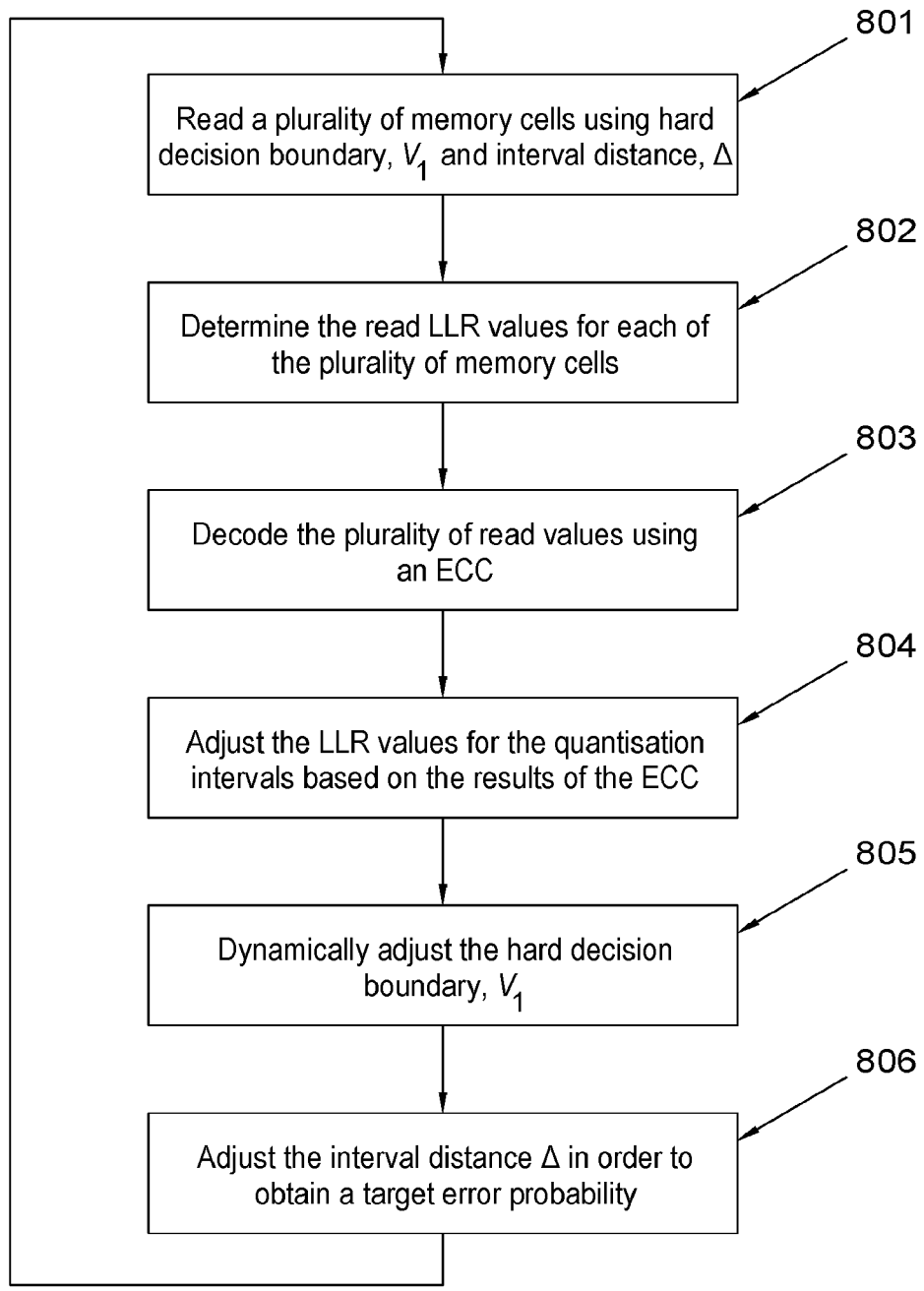
FIG. 8 shows a method of dynamically tracking decision boundaries in a memory cell according to an embodiment.

FIG. 8 shows a method of dynamically tracking decision boundaries in a memory cell according to an embodiment. In step 801 the method begins by the control unit 140 reading a plurality of memory cells in the non-volatile flash memory 130 using an initial hard decision boundary $V_1$ and an initial interval distance Δ.

The initial hard decision boundary $V_1$ and the initial interval distance Δ may be predetermined by a user and stored in the memory 160. In an embodiment the method is initialised in steps 801 and 802 using information that is based on prior knowledge of the flash memory cell. Prior knowledge could include information obtained from the manufacturer of the flash memory.

In step 802 the processor 150 determines the read LLR values for each of the plurality of memory cells by associating the threshold voltage with a quantisation interval. As discussed above, during the reading process a memory cell's threshold voltage is determined by monitoring the level of channel conduction for various applied gate voltages. Each quantisation interval is bound by two voltages, consequently by knowing the threshold voltage it is possible to determine a read quantisation interval for each memory cell. In soft decoding each quantisation interval has an LLR value associated with it. As a result it is possible to determine an LLR value for a memory cell by associating the threshold voltage with a quantisation interval. In an embodiment the LLR values for each of quantisation intervals are stored in a look-up table. In a further embodiment the look-up table is stored in the memory 160.

In step 803 the plurality of read values are decoded using an error correcting code (ECC) by the control unit 140. The error correcting code used in step 803 for decoding the read data values is the same code as was used to encode the data before it was written to the memory cells.

In step 804 new LLR values are generated by the processor 150 for the quantisation intervals. New LLR values can be generated in any number of ways; not least by exploiting the characteristics of the error correcting code (ECC) as described in U.S. patent application Ser. No. 16/205,924, estimating errors as described in U.S. patent application Ser. No. 16/206,148 or interpolating different readings as described in US publication number 2016/0277041, all of which are incorporated herein by reference.

In an embodiment new LLR values are generated by the processor 150 for each quantisation interval. In a further embodiment new LLR values are only generated for some of the quantisation intervals (e.g. intervals that are directly adjacent to the hard decision boundary). In a further embodiment, the new LLR values that are generated in step 804 are stored in a look-up table.

In step 805 the hard decision boundaries are dynamically adjusted by the processor 150. In one embodiment the dynamic adjustment of the hard decision boundaries is performed in accordance with the method described with reference to FIG. 7.

In step 806 the interval distance, $\Delta$, is adjusted in order to obtain a target error probability. The interval distance, $\Delta$, is adjusted according to:

$$\Delta \leftarrow \Delta + \beta d_{soft} \quad (10)$$

$$\beta = \begin{cases} 1 & P_e^{(r)} > P_e^{(target)} \\ -1 & P_e^{(r)} < P_e^{(target)} \end{cases} \quad (11)$$

Where:
$P_e^{(r)}$ is the error probability for the $r^{th}$ quantisation interval (or voltage bin);
$P_e^{(target)}$ is the a pre-defined target error probability;
$d_{soft}$ is a pre-defined incremental voltage adjustment; and
$\Delta$ is the interval distance between the hard decision boundary and the soft decision boundary.

Equation 3 (repeated below for convenience) details a relationship between the magnitude of an LLR value, $|L_r|$, and the error probability, $P_e^{(r)}$, for a given quantitation interval.

$$|L_r| = \log \frac{1 - P_e^{(r)}}{P_e^{(r)}} \quad (3)$$

Consequently, after new LLR values are generated in step 804 then the error probability for a given quantisation interval can be determined. Once the error probability for a quantisation interval has been determined the processor 150 adjusts the boundaries of the quantisation interval depending on the determined error probability, $P_e^{(r)}$, and the target error probability, $P_e^{(target)}$.

As shown in FIG. 6; the same quantisation interval length, $\Delta$, is used to specify the position of the first soft decision boundary, 604, and the second soft decision boundary 605 or in other words the soft decision boundaries are equispaced around the hard decision boundary 603. In an embodiment only one of: the new LLR value for quantisation interval 608 or the new LLR value for the quantisation interval 609 is used to calculate the error probability and subsequently adjust the quantisation interval length, $\Delta$. In a different embodiment both LLR values for the quantisation intervals 608 and 609 are used when calculating the error probability.

If the determined error probability, $P_e^{(r)}$, is too large then the quantisation region is too small. Consequently, in order to reduce the error probability (i.e. the area in a quantisation interval under the erroneous probability distribution relative to the area under the correct probability distribution) the processor 150 increases the quantisation interval length, $\Delta$, and therefore reduces the area under the incorrect distribution relative to the area under the correct distribution and consequently the error probability.

In an embodiment the target error probability $P_e^{(target)}$ is pre-defined by a user or a manufacturer. The numerical value of the target error probability, $P_e^{(target)}$, depends on the probability distributions of the data storage states for the memory being read. As previously discussed; these probability distributions can depend on the characteristics of the device in question and the manner in which it is programmed. Consequently, in an embodiment, the target error probability, $P_e^{(target)}$, is set by a manufacturer after evaluating the characteristics of the flash memory. In a further embodiment the target error probability $P_e^{(target)}$ is stored in the memory 160.

Before restarting the method at step 801 the processor 150 may wait for a delay to pass. In one embodiment the delay is based on the number of actions (e.g. reads and writes) performed on the plurality of memory cells, i.e. every 100 reads, every 1000 reads, every 10000 reads etc. In a further embodiment adjustment of the decision boundaries is performed after a pre-defined time period has elapsed.

In a further embodiment, after step 806, new LLR values are generated using the new positions of the soft decision boundaries. In keeping with step 804, after new LLR values are generated these may be stored in a look-up table for use in step 802.

In step 806 the interval distance, $\Delta$, is adjusted by the processor 150 according to the error probability that is determined from the newly calculated LLR value. In an alternative embodiment the interval distance, $\Delta$, is adjusted based on achieving a target LLR value, thereby eliminating the need to calculate the error probability.

The method described above was discussed in relation to the determination of a single interval distance Δ relative to one hard decision boundary however for the avoidance of doubt it is emphasised that the above described method could be applied to determining the decision boundaries for each bit of a memory cell storing more than one data bit by applying the above described method to each hard decision boundary.

In these cases the method is executed for each of the hard decision boundaries between the different states of the multi-level flash memory cell. In this example each quantisation interval r has its own interval distance Δ and consequently its own error probability $P_e^{(r)}$.

By exploiting information that has already been obtained through estimating LLRs, the dynamic decision boundary estimation method discussed herein is able to provide a good estimate of the optimal quantization intervals in a low-complexity manner. The method disclosed above is particularly advantageous since it operates blind and does not require any training or side information.

The performance of various embodiments has been evaluated using simulation. In these simulations the method of soft decoding data discussed above was tested on a flash memory with multilevel cells (i.e. two bits per cell) and impairments (e.g. inaccurate programming, retention noise, random telegraph noise, device aging and inter cell interference). Since the flash memory cell is multi-level the method of dynamic boundary estimation described in FIG. 8 was repeated for both of the stored data bits thereby creating two separate LLR tables and two sets of soft boundaries.

In the following simulations a (9216, 8192) regular LDPC code with a variable degree $d_v=3$ and a constraint degree $d_c=27$ was used along with a min-sum LDPC decoder. In the following simulations the method of soft decoding as described above was performed using LLR values which were generated according to U.S. patent application Ser. No. 16/205,924, which is incorporated herein by reference.

Figure 9:
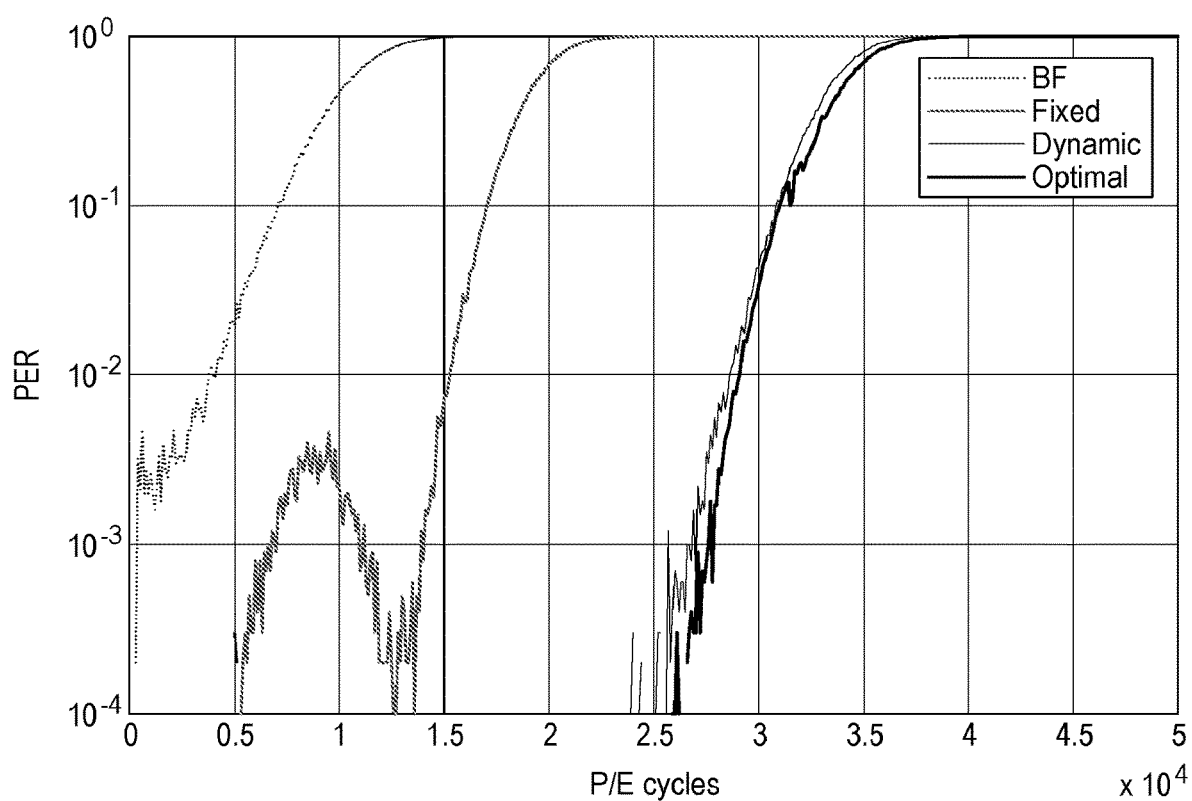
FIG. 9 shows a simulated Packet Error Rate (PER) vs a number of Program/Erasure (P/E) cycles for the MSB of a MLC.

FIG. 9 shows a simulated Packet Error Rate (PER) vs a number of Program/Erasure (P/E) cycles for the MSB of a MLC. In FIG. 9 the legend entries are used to identify the performance of the following methods:

"BF"—A method of reading the stored data value of a memory cell where only hard decision data is obtained and is subsequently used in a bit-flipping LDPC decoding.

"Fixed"—A method of reading the stored data value of a memory cell where only hard decision data is obtained and a fixed LLR value is assigned to these estimates.

"Optimal"—A method of reading the stored data value of a memory cell where the probability distributions for all of the data states and P/E cycles are found from offline simulations and the boundaries are subsequently chosen to maximise the Mutual Information (MI).

"Dynamic"—The method of reading the stored data value of a memory cell as described above in FIG. 8 where LLR values are generated in accordance with U.S. patent application Ser. No. 16/205,924.

FIG. 9 shows that the method described herein (labelled "Dynamic") outperforms the two methods of data recovery which don't make use of soft detection boundaries (i.e. "BF" and "Fixed"). Furthermore FIG. 9 shows that the method described above only has a small degradation compared to the genie-aided detection (labelled "Optimal") which is impractical for real world systems.

Figure 10:
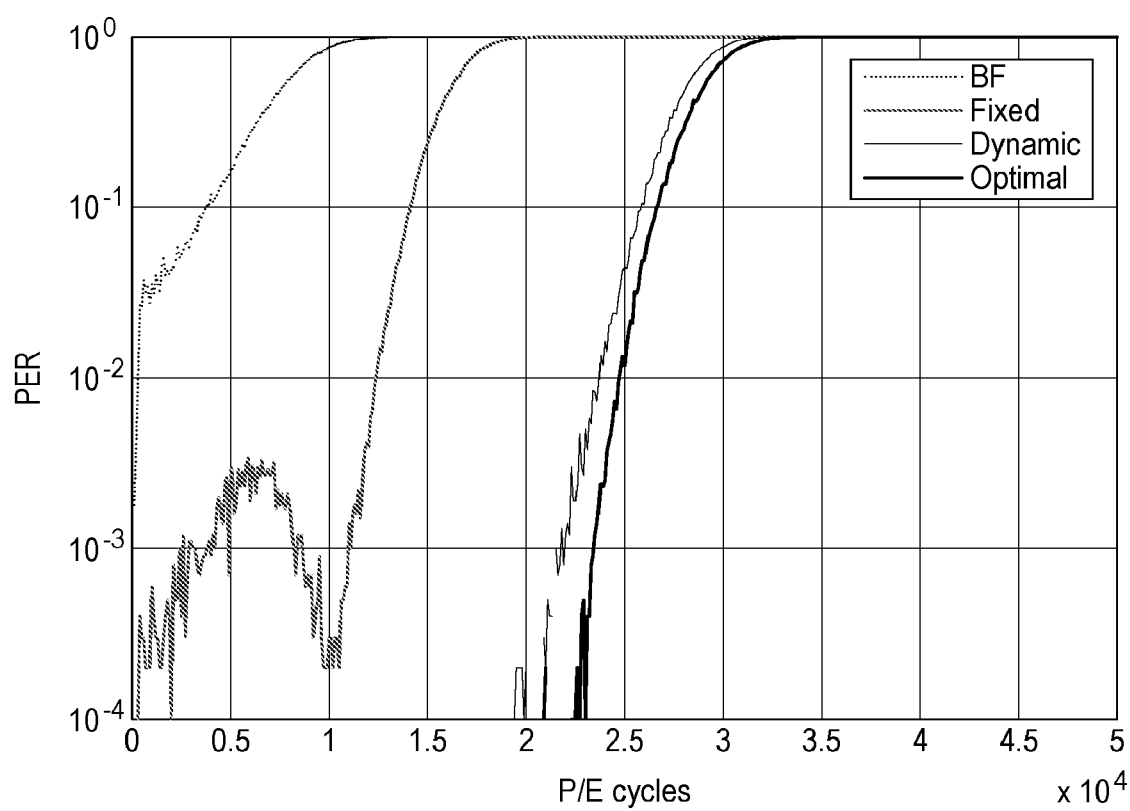
FIG. 10 shows a simulated Packet Error Rate (PER) vs a number of Program/Erasure (P/E) cycles for the LSB of a MLC.

FIG. 10 shows a simulated Packet Error Rate (PER) vs a number of Program/Erasure (P/E) cycles for the LSB of a MLC. In keeping with FIG. 9, FIG. 10 also shows that the method described above only has a small degradation compared to the genie-aided detection (labelled "Optimal") when determining the LSB of the stored data.

Figure 11:
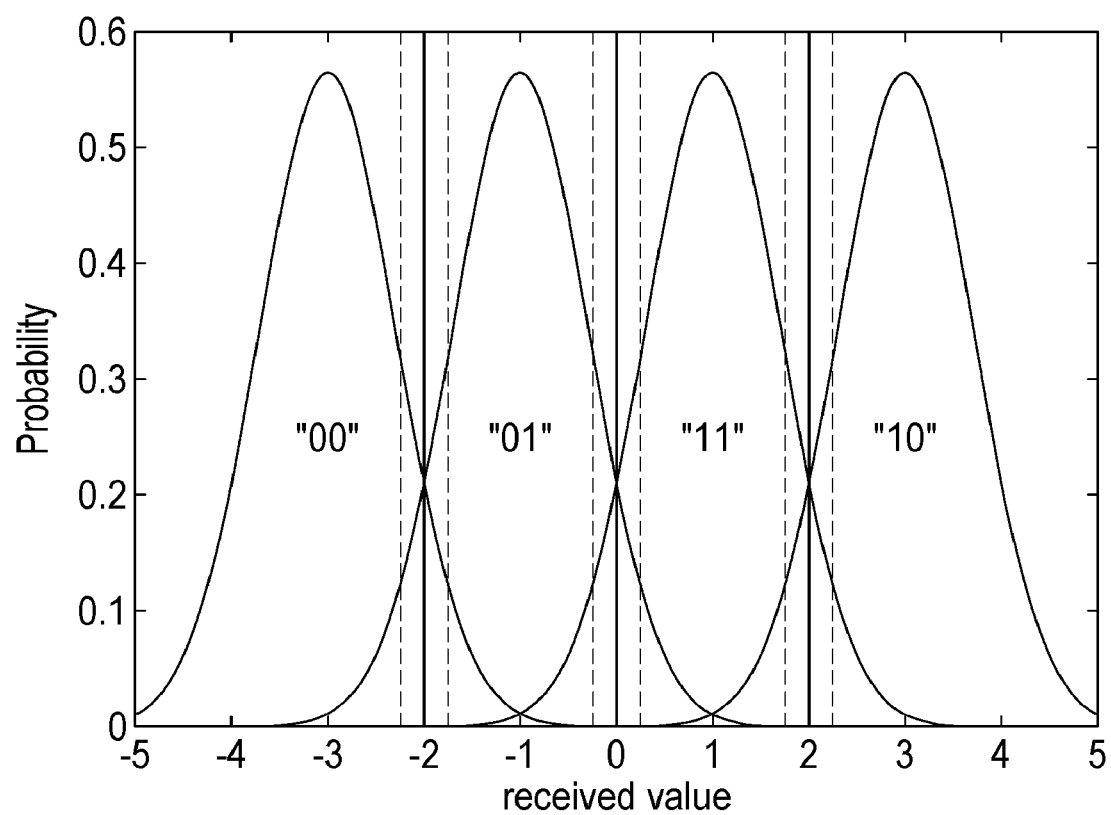
FIG. 11 shows the distributions of four signals received in a wireless amplitude modulated signal transmission method.

FIG. 11 shows the distributions of four signals received in a wireless amplitude modulated signal transmission method. As can be seen from FIG. 11, the signal distributions overlap in the same manner as discussed above with reference to data read from flash memory. The signal values received are floating point values that can be compared to the "hard decision" boundaries shown in solid lines between the signal distributions in FIG. 11. One or more soft decision boundaries (shown in dashed lines in FIG. 11) are further defined on either side of one or more of the hard decision boundaries, similar to the threshold values $t_r^*$ and $t_l^*$ shown in FIG. 4a, and the received floating point values are compared to these boundaries. The hard and soft decision boundaries can then be adjusted in the same manner as discussed above.

While certain arrangements have been described, the arrangements have been presented by way of example only, and are not intended to limit the scope of protection. The inventive concepts described herein may be implemented in a variety of other forms. In addition, various omissions, substitutions and changes to the specific implementations described herein may be made without departing from the scope of protection defined in the following claims.

The invention claimed is:

1. A method of generating soft decision detection parameters for a plurality of received signals, the method performed by a device in a signal receiver, the method comprising:
    defining a hard decision boundary and a plurality of quantisation intervals wherein each quantisation interval extends from the hard decision boundary by an interval distance;
    selecting a log likelihood value from a set of log likelihood values for each received signal based on the quantisation interval in which the received signal is detected;
    performing a soft decoding using a plurality of log likelihood values;
    adjusting the set of log likelihood values based on a result of the soft decoding;
    determining an error probability for a quantisation interval;
    comparing the error probability against a target error probability; and
    adjusting the interval distance in order to obtain the target error probability,
    wherein the signal receiver is configured to generate soft decision information for a signal using the hard decision boundary and the interval distance determined by the device.

2. The method according to claim 1, wherein the error probability for a quantisation interval is determined using a log likelihood value from the adjusted set of log likelihood values.

3. The method according to claim 2, further comprising:
    adjusting the hard decision boundary by:
        calculating a fraction of the plurality of received signals that have a detected value which is less than the hard decision boundary;
        determining whether the fraction of the received signals is less than a threshold; and
        modifying the hard decision boundary by:
            reducing the hard decision boundary when the fraction is greater than the threshold; and increasing the hard decision boundary when the fraction is less than the threshold.

4. The method according to claim 3, wherein the threshold equals an expected number of received signals with a detected value which is less than the hard decision boundary relative to a total number of received signals.

5. The method according to claim 4, wherein adjusting the interval distance in order to obtain a target error probability further comprises:
increasing the interval distance when the error probability is greater than the target error probability; and
decreasing the interval distance when the error probability is less than the target error probability.

6. The method according to claim 5 wherein the plurality of quantisation intervals comprises:
a first quantisation interval that extends to a first soft decision boundary wherein the first soft decision boundary is less than the hard decision boundary; and
a second quantisation interval that extends to a second soft decision boundary wherein the second soft decision boundary is greater than the hard decision boundary.

7. The method according to claim 6, wherein the method is repeated for each hard decision boundary of a number of hard decision boundaries, said number equaling a total number of system states minus one.

8. The method according to claim 7, further comprising:
adjusting the set of log likelihood values based on the adjusted interval distance.

9. The method according to claim 8, wherein the method is repeated after a predetermined number of signals have been received.

10. A signal receiver comprising a device for generating soft decision detection parameters for a plurality of received signals comprising a processor and a memory storing instructions for execution by the processor, the instructions causing the processor when executing the instructions to:
define a hard decision boundary and a plurality of quantisation intervals wherein each quantisation interval extends from the hard decision boundary by an interval distance;
select a log likelihood value from a set of log likelihood values for each received signal based on the quantisation interval in which the received signal is detected;
perform a soft decoding using a plurality of log likelihood values;
adjust the set of log likelihood values based on a result of the soft decoding;
determine an error probability for a quantisation interval;
compare the error probability against a target error probability; and
adjust the interval distance in order to obtain the target error probability,
wherein the signal receiver is configured to generate soft decision information for a signal using the hard decision boundary and the interval distance determined by the device.

11. The device of claim 10, wherein the error probability for a quantisation interval is determined using a log likelihood value from the adjusted set of log likelihood values.

12. The device of claim 11, wherein the instructions further cause the processor when executing the instructions to:
adjust the hard decision boundary by:
calculating a fraction of the plurality of received signals that have a detected value which is less than the hard decision boundary;
determining whether the fraction of the received signals is less than a threshold; and
modifying the hard decision boundary by:
reducing the hard decision boundary when the fraction is greater than the threshold; and
increasing the hard decision boundary when the fraction is less than the threshold.

13. The device of claim 12, wherein the threshold equals an expected number of received signals with a detected value which is less than the hard decision boundary relative to a total number of received signals.

14. The device of claim 13, wherein adjusting the interval distance in order to obtain a target error probability further comprises:
increasing the interval distance when the error probability is greater than the target error probability; and
decreasing the interval distance when the error probability is less than the target error probability.

15. The device of claim 14, wherein the plurality of quantisation intervals comprises:
a first quantisation interval that extends to a first soft decision boundary wherein the first soft decision boundary is less than the hard decision boundary; and
a second quantisation interval that extends to a second soft decision boundary wherein the second soft decision boundary is greater than the hard decision boundary.

16. The device of claim 15, wherein the instructions are repeated for each hard decision boundary of a number of hard decision boundaries, said number equalling a total number of system states minus one.

17. The device of claim 16, wherein the instructions further cause the processor when executing the instructions to:
adjust the set of log likelihood values based on the adjusted interval distance.

18. The device of claim 17, wherein the instructions are repeated after a predetermined number of signals has been received.

19. A method of generating soft decision detection parameters for a plurality of received signals, the method performed by a device in a flash memory comprising a plurality of flash memory cells, the method comprising:
defining a hard decision boundary and a plurality of quantisation intervals wherein each quantisation interval extends from the hard decision boundary by an interval distance;
selecting a log likelihood value from a set of log likelihood values for each received signal based on the quantisation interval in which the received signal is detected;
performing a soft decoding using a plurality of log likelihood values;
adjusting the set of likelihood values based on a result of the soft decoding;
determining an error probability for a quantisation interval;
comparing the error probability against a target error probability; and
adjusting the interval distance in order to obtain the target error probability,
wherein the flash memory is configured to read a flash memory cell and generate soft decision information for the flash memory cell using the hard decision boundary and the interval distance determined by the device.

20. A flash memory comprising a plurality of flash memory cells and a device for generating soft decision detection parameters for a plurality of received signals comprising a processor and a memory storing instructions for execution by the processor, the instructions causing the processor when executing the instructions to:
- define a hard decision boundary and a plurality of quantisation intervals wherein each quantisation interval extends from the hard decision boundary by an interval distance;
- select a log likelihood value from a set of log likelihood values for each received signal based on the quantisation interval in which the received signal is detected;
- perform a soft decoding using a plurality of log likelihood values;
- adjust the set of likelihood values based on a result of the soft decoding;
- determine an error probability for a quantisation interval;
- compare the error probability against a target error probability; and
- adjust the interval distance in order to obtain the target error probability,
- wherein the flash memory is configured to read a flash memory cell and generate soft decision information for the flash memory cell using the hard decision boundary and the interval distance determined by the device.

* * * * *